United States Patent
Itatani et al.

(10) Patent No.: US 6,777,159 B1
(45) Date of Patent: Aug. 17, 2004

(54) METHOD FOR FORMING POLYIMIDE PATTERN USING PHOTOSENSITIVE POLYIMIDE AND COMPOSITION FOR USE THEREIN

(75) Inventors: Hiroshi Itatani, Yokohama (JP); Shunichi Matsumoto, Kamakura (JP); Tarou Itatani, Tsukuba (JP); Tsunenori Sakamoto, Tsukuba (JP); Sucheta Gorwadkar, Tsukuba (JP); Masanori Komuro, Tsukuba (JP)

(73) Assignees: PI R&D Co., Ltd., Kanagawa (JP); The National Institute of Advanced Industrial Science and Technology, Tokyo (JP)

( * ) Notice: Subject to any disclaimer, the term of this patent is extended or adjusted under 35 U.S.C. 154(b) by 249 days.

(21) Appl. No.: 09/980,212

(22) PCT Filed: May 31, 2000

(86) PCT No.: PCT/JP00/03502
§ 371 (c)(1),
(2), (4) Date: Mar. 18, 2002

(87) PCT Pub. No.: WO00/73853
PCT Pub. Date: Dec. 7, 2000

(30) Foreign Application Priority Data

May 31, 1999 (JP) .......................... 11/189469
Feb. 16, 2000 (JP) ....................... 2000/105593

(51) Int. Cl.$^7$ ................................................ G03F 7/004
(52) U.S. Cl. .................... 430/270.1; 430/325; 430/326; 430/905
(58) Field of Search .......................... 430/270.1, 325, 430/326, 905

(56) References Cited

U.S. PATENT DOCUMENTS 6,627,377 B1 * 9/2003 Itatani et al. ............ 430/270.1

FOREIGN PATENT DOCUMENTS

| JP | A62-280736 | 12/1987 |
| JP | A4-168441 | 6/1992 |
| JP | A4-204738 | 7/1992 |
| JP | A5-204154 | 8/1993 |
| JP | A59-100135 | 6/1994 |
| JP | A9-304930 | 11/1997 |
| JP | 11-84653 A | 3/1999 |
| JP | A2000-26603 | 1/2000 |
| JP | A2000-34347 | 2/2000 |

* cited by examiner

Primary Examiner—Rosemary Ashton
(74) Attorney, Agent, or Firm—Birch, Stewart, Kolasch & Birch, LLP

(57) ABSTRACT

This invention relates to a photosensitive polyimide material having positive-type or negative-type photosensitivity, which may be developed with a high resolution with an irradiation energy having short wavelength such as ultraviolet light or electron beam. The positive-type photosensitive polyimide composition comprising a solvent-soluble polyimide which shows positive-type photosensitivity in the presence of a photoacid generator, which is obtained by polycondensation of at least one aliphatic tetracarboxylic dianhydride and/or alicyclic tetracarboxylic dianhydride and at least one aliphatic diamine and/or alicyclic diamine and/or diaminosiloxane; and the photoacid generator. Since the polyimide has negative-type photosensitivity when irradiated with electron beam in the absence of a photoacid generator, a method for forming negative-type polyimide pattern using the polyimide is also provided.

18 Claims, No Drawings

METHOD FOR FORMING POLYIMIDE PATTERN USING PHOTOSENSITIVE POLYIMIDE AND COMPOSITION FOR USE THEREIN

This application is the national phase under 35 U.S.C. § 371 of PCT International Application No. PCT/JP00/03502 which has an International filing date of May 31, 2000, which designated the United States of America.

TECHNICAL FIELD

The present invention relates to a method for forming polyimide pattern using photosensitive polyimide and composition therefor. The present invention is useful for microscopic processing of semiconductors, thin film magnetic heads of hard disk drives and the like, and liquid crystal displays.

BACKGROUND ART

In production of various electronic parts including semiconductor integrated circuits such as LSI, thin film magnetic heads of hard disk drives and the like, and liquid crystal displays, very fine processing using lithography is employed, and photoresists are widely used in the processing.

For electronic devices, not only high density and high performance, but also large number of functions and high diversity are demanded, and photoresist patterns with sizes of as small as less than 1 μm are formed.

Therefore, the light source used for irradiation is now being shifted from g-line of mercury lamp (436 nm) to those having shorter wavelengths, that is, to i-line (365 nm) of mercury lamp, and further to KrF excimer laser (248 nm) and ArF excimer laser (193 nm).

Photoresist materials which are excellent in transparency to ultrashort wave, which have high sensitivity and high resolution, and which have resistance to etching for microscopic processing have been proposed.

Aliphatic compounds such as acrylic esters and alicyclic compounds of polyvinylphenol, which have higher Tg than the conventional novolak type resins have been proposed. However, a photoresist which may be used as a standard product, which satisfies the demands for positive-type photoresist, such as good development by alkali, adhesion to substrate and resistance to dry etching, has not been available.

Polyimides are excellent in heat resistance, mechanical strength, and electric insulation properties, and are recently applied to the field of semiconductors for which high reliability is demanded. Polyimides are applied in semiconductors as passivation films, buffer coat films, α-ray-shielding films, interlayer insulation films and the like, and positive-type photosensitive polyimides which can be developed with an alkaline solution are now demanded rather than the conventional negative-type photosensitive polyimides.

Although it has been tried to give positive-type photosensitivity by converting polyamic acid which is an unstable intermediate of polyimide to an ester derivative, the compound is poor in stability during storage, and a heat treatment at a temperature not lower than 350° C. is necessary for imidation so that distortion is generated when the polyimide is used for lamination of semiconductors (Y. Yamaoka et al.: J. Photopoly. Sci. Tech. Vol.9 293(1996)).

The present applicant previously developed a photosensitive polyimide composition and filed a patent application directed thereto (WO99/19771). This photosensitive polyimide composition comprises a photoacid generator and a solvent-soluble polyimide which shows positive-type photosensitivity in the presence of the photoacid generator. This photosensitive polyimide composition is soluble in an organic solvent, excels in adhesiveness, heat resistance, mechanical properties and in flexibility, and exhibits the properties of highly sensitive positive-type alkali-soluble photoresist upon irradiation with light.

However, with the photosensitive polyimide composition disclosed in WO99119771, satisfactory resolution is not necessarily attained when a pattern with high resolution is to be formed by selectively exposing the polyimide to a light having a short wavelength or electron beam.

DISCLOSURE OF THE INVENTION

Accordingly, an object of the present invention is to provide a method for forming thin film pattern of polyimide, by which a pattern having a high resolution may be formed by selective exposure with a light having a short wavelength such as i-line (365 nm) of Hg-line, KrF excimer laser (248 nm) or ArF excimer laser (193 nm).

The present inventors intensively studied to discover that by selectively exposing the polyimide obtained by polycondensation between an aliphatic or alicyclic tetracarboxylic dianhydride and an aliphatic or alicyclic diamine or diaminosiloxane, which polyimide is not disclosed in WO99/19771 to a light having a short wavelength or electron beam, a pattern having high resolution may be formed, thereby completing the present invention.

That is, the present invention provides a positive-type photosensitive polyimide composition comprising a solvent-soluble polyimide which shows positive-type photosensitivity in the presence of a photoacid generator, which is obtained by polycondensation of at least one aliphatic tetracarboxylic dianhydride and/or alicyclic tetracarboxylic dianhydride and at least one aliphatic diamine and/or alicyclic diamine and/or diaminosiloxane; and the photoacid generator. The present invention also provides a method for forming a pattern of positive-type photosensitive polyimide comprising the steps of forming a photosensitive layer consisting essentially of polyimide composition according to the present invention on a substrate; selectively irradiating the photosensitive layer with a light beam having a wavelength of not more than 365 nm; heat-treating the photosensitive layer; and developing the photosensitive layer after the heat-treatment to selectively remove prescribed regions in the photosensitive layer. The present invention also provides a use of the polyimide of the present invention as a material for positive-type photolithography. The present invention further provides a method for forming negative-type pattern of polyimide comprising coating a substrate with the polyimide in the polyimide composition according to the present invention; selectively irradiating the polyimide with an actinic ray, the irradiated regions constituting a desired pattern; and developing the irradiated polyimide with an alkaline solution to dissolve the non-irradiated regions. The present invention still further provides a use of the polyimide in the polyimide composition according to the present invention as a material for negative-type photolithography.

By the method of the present invention, polyimide thin film patterns having high resolution may be formed by selective exposure of the polyimide thin film to a light having a short wavelength or electron beam, such as i-line (365 nm) of Hg-line, KrF excimer laser (248 nm) or ArF excimer laser (193 nm). The photosensitive polyimide used in the method of the present invention is excellent in solubility in alkaline developing solutions, and has sufficient resistance to dry etching. Further, the polyimide has excellent insulation performance and heat resistance. Therefore, the present invention is advantageous for microscopic processing or the like of semiconductors, thin film magnetic heads of hard disk drives, liquid crystal displays and the like.

BEST MODE FOR CARRYING OUT THE INVENTION

The polyimide used in the method of the present invention is a solvent-soluble polyimide which shows positive-type photosensitivity in the presence of a photoacid generator, which is obtained by polycondensation of at least one aliphatic tetracarboxylic dianhydride and/or alicyclic tetracarboxylic dianhydride and at least one aliphatic diamine and/or alicyclic diamine and/or diaminosiloxane.

The polyimide shows positive-type photosensitivity when irradiated with a light in the presence of a photoacid generator, and shows negative-photosensitivity when irradiated with an electron beam in the absence of a photoacid generator (although it shows negative-type photosensitivity even in the presence of the photoacid generator).

The term "aliphatic tetracarboxylic dianhydride" means the tetracarboxylic dianhydride in which the moiety constituting the main chain of the polyimide consists of an aliphatic structure, and the number of carbon atoms constituting the aliphatic structure is preferably 1 to 15. The aliphatic structure may be either linear or branched, and may contain (an) oxygen atom(s) (ether, ketone or the like) and/or (a) nitrogen atom(s) (secondary, tertiary or quaternary amine or the like) and/or (a) sulfur atom(s) (sulfide, disulfide, thioether, thiocarbonyl or the like). Thus, the term "aliphatic" as used in the specification and claims also include those containing such (a) heteroatom(s) (this definition is also applied to the term "aliphatic diamine"). The number of the heteroatom(s) is preferably about 1 to 3. The aliphatic structure is preferably a saturated aliphatic structure. Although other structures which do not adversely affect the advantageous feature of the present invention may exist in the side chains, the tetracarboxylic dianhydride, including the side chains, most preferably consists of an aliphatic structure (with the proviso that the above-mentioned oxygen atom(s) and/or nitrogen atom(s) and/or sulfur atom(s) may be contained) and/or alicyclic structure (with the proviso that the above-mentioned oxygen atom(s) and/or nitrogen atom(s) and/or sulfur atom(s) may be contained).

The term "alicyclic tetracarboxylic dianhydride" means the tetracarboxylic dianhydride in which the moiety constituting the main chain of the polyimide consists of an alicyclic hydrocarbon, and the number of carbon atoms in the alicyclic moiety is preferably 3 to 20. The alicyclic moiety may contain (an) oxygen atom(s) (ether, ketone or the like) and/or (a) nitrogen atom(s) (secondary, tertiary or quaternary amine or the like) and/or (a) sulfur atom(s) (sulfide, disulfide, thioether, thiocarbonyl or the like). Thus, the term "alicyclic" as used in the specification and claims also include those containing such (a) heteroatom(s) (this definition is also applied to the term "alicyclic diamine"). In cases where the alicyclic moiety contains the heteroatom(s), the alicyclic moiety is heterocyclic. The number of the heteroatom(s) is preferably about 1 to 3. The alicyclic moiety is preferably a saturated alicyclic moiety, especially saturated alicyclic moiety containing 4 to 8 carbon atoms. The moiety constituting the main chain of the polyimide is preferably one consisting of the alicyclic structure and/or the above-mentioned aliphatic structure (with the proviso that the above-mentioned oxygen atom(s) and/or nitrogen atom(s) and/or sulfur atom(s) may be contained). Although other structures which do not adversely affect the advantageous feature of the present invention may exist in the side chains, the tetracarboxylic dianhydride, including the side chains, most preferably consists of an alicyclic structure (with the proviso that the above-mentioned oxygen atom(s) and/or nitrogen atom(s) and/or sulfur atom(s) may be contained) and/or the above-mentioned alicyclic structure (with the proviso that the above-mentioned oxygen atom(s) and/or nitrogen atom(s) and/or sulfur atom(s) may be contained) and/or the siloxane structure described below.

The tetracarboxylic dianhydrides in which the moiety constituting the main chain of the polyimide consists of a structure having an alicyclic ring to which an aliphatic group is bound may also preferably be employed. In this case, as the alicyclic structure and as the aliphatic group, those described above, respectively, are preferred. Thus, the polyimides in which the moiety constituting the main chain consists of the alicyclic structure and the aliphatic structure are also included in "alicyclic" in this specification and claims (this definition is also applied to diamines").

Preferred examples of the tetracarboxylic dianhydride (described in the form of monomers) constituting the polyimide include saturated alicyclic tetracarboxylic dianhydrides, bicyclo(2,2,2)-oct-7-ene-2,3,5,6-tetracarboxylic dianhydride and 5-(2,5-dioxo-tetrafurfuryl)-3-methyl-4-cyclohexene-1,2-dicarboxylic dianhydride. These may be employed individually or in combination.

The above-described tetracarboxylic dianhydride may be employed individually or in combination.

Especially preferred examples of the tetracarboxylic dianhydride (described in the form of monomers) constituting the polyimide used in the present invention include saturated alicyclic tetracarboxylic dianhydrides, particularly cyclopentanetetracarboxylic dianhydride, cyclohexanetetracarboxylic dianhydride and cyclobutanetetracarboxylic dianhydride. These may be employed individually or in combination. Since these compounds do not contain a double bond in the molecule, they are highly transparent to ultraviolet radiation having extremely short wavelength, and give high sensitivity and high resolution as positive-type photoresist materials.

The term "aliphatic diamine" constituting the polyimide used in the method of the present invention means the diamine in which the moiety constituting the main chain of the polyimide consists of an aliphatic structure, and the number of carbon atoms constituting the aliphatic structure is preferably 1 to 15. The aliphatic structure may be either linear or branched, and may contain (an) oxygen atom(s) (ether, ketone or the like) and/or (a) nitrogen atom(s) (primary, secondary, tertiary or quaternary amine or the like). The number of the heteroatom(s) (other than the two nitrogen atoms inevitably contained to constitute diamine) is preferably about 1 to 3. Although other structures which do not adversely affect the advantageous feature of the present invention may exist in the side chains, the diamine, including the side chains, most preferably consists of an aliphatic structure (with the proviso that the above-mentioned oxygen atom(s) and/or nitrogen atom(s) and/or sulfur atom(s) may be contained) and/or the below-described alicyclic structure (with the proviso that the above-mentioned oxygen atom(s) and/or nitrogen atom(s) and/or sulfur atom(s) may be contained) and/or the siloxane structure described below.

The term "alicyclic diamine" means the diamine in which the moiety constituting the main chain of the polyimide consists of an alicyclic hydrocarbon, and the number of carbon atoms in the alicyclic moiety is preferably 3 to 15. The alicyclic moiety may contain (an) oxygen atom(s) (ether, ketone or the like) and/or (a) nitrogen atom(s) (primary, secondary, tertiary or quaternary amine or the like) and/or (a) sulfur atom(s) (sulfide, disulfide, thioether, thiocarbonyl or the like). In cases where the alicyclic moiety contains the heteroatom(s), the alicyclic moiety is heterocyclic. The number of the heteroatom(s) (other than the two nitrogen atoms inevitably contained to constitute diamine) is preferably about 1 to 6. The alicyclic moiety is preferably a saturated alicyclic moiety, especially saturated alicyclic moiety containing 4 to 8 carbon atoms. Although other structures which do not adversely affect the advantageous feature of the present invention may exist in the side chains, the diamine, including the side chains, most preferably consists of an alicyclic structure (with the proviso that the above-mentioned oxygen atom(s) and/or nitrogen atom(s) and/or sulfur atom(s) may be contained) and/or the above-mentioned alicyclic structure (with the proviso that the above-mentioned oxygen atom(s) and/or nitrogen atom(s) and/or sulfur atom(s) may be contained) and/or the siloxane structure described below. As described in the explanation of the tetracarboxylic dianhydride, the term "alicyclic" include those wherein the moiety constituting the main chain consists of an alicyclic ring on which an aliphatic group is bound.

The term "diaminosiloxane" constituting the polyimide used in the method of the present invention means the diamine in which the moiety constituting the main chain consists of siloxane structure. The number of silicon atom(s) is preferably about 1 to 50. Each silicon atom in the siloxane structure may be substituted with one or more lower ($C_1$–$C_6$) alkyl group and/or lower ($C_1$–$C_6$)alkoxy group. In addition to the siloxane structure, the diaminosiloxane may contain the above-mentioned aliphatic moiety and/or alicyclic moiety, and other structures which do not adversely affect the advantageous feature of the present invention, especially in side chains.

The above-mentioned diamine may be employed individually or in combination.

Preferred examples of the diamine (described in the form of monomers) used in the present invention include 1,3-bis (3-aminomethyl)cyclohexane, 4,4'-diamino-dicyclohexyl-methane, bis(2-aminoethoxy)ethane, N,N-bis(3-aminopropyl)methylamine, ethylenediamine, 2,2'-diaminodiethyldisulfide, 1,4-bis(3-aminopropyl)piperazine, 3,4bis(3-aminopropyl)2,4,8,10-tetraoxa[5,5]undecane, diaminosiloxane, trans-1,4-diaminocyclohexane, 1,3-diamino-2-hydroxypropane and 3(4),8(9)-bis(aminoethyl) tricyclo[5,2,1,0]decane. These may be employed individually or in combination.

Other preferred examples of the diamine (described in the form of monomers) used in the method of the present invention include diaminosiloxanes such as 1,3-bis(3-aninopropyl)tetramethyldisiloxane (molecular weight: 248.5) and diaminosiloxane having amino groups at both ends (amine value: 300–500), and the aliphatic polyimides using these diaminosiloxanes have good adhesion to semiconductor substrates.

In cases where the above-mentioned aliphatic or alicyclic diarnine or diaminosiloxane contains disulfide moiety, since the disulfide reacts with an acid to easily become thiol, images are formed with high sensitivity and high resolution.

Preferred examples of the diamine containing disulfide moiety include diarninodialkyldisulfides containing $C_{1-C6}$ alkyl group, such as diaminodiethyldisulfide.

Especially preferred aliphatic diamine used in the method of the present invention are aliphatic disulfides and/or diaminosiloxanes, and the polyimides containing these form images with high sensitivity and high resolution.

The polyimide contained in the composition of the present invention is solvent soluble. Here, the term "solvent soluble" means that the polyimide is dissolved in N-methyl-2-pyrrolidone (NMP) to a concentration of not less than 5% by weight, preferably not less than 10% by weight.

The weight average molecular weight of the polyimide contained in the composition according to the present invention is preferably 5000 to 100,000, more preferably 5000 to 50,000. If the weight average molecular weight is 5000 to 100,000, good solvent solubility, membrane-forming property, membrane strength and insulation performance may be obtained.

The polyimide used in the method of the present invention may preferably be synthesized by mixing the above-mentioned tetracarboxylic dianhydride and the above-mentioned diamine at molar ratio of 1:(0.95–1.05) in an organic solvent and heating the mixture in the presence of an acid catalyst at 140–200° C., preferably at 150–180° C. The generated water is eliminated from the reaction system by azeotropic distillation with toluene, xylene, decalin or the like.

The polyimide used in the method of the present invention may be produced by a process using the catalyst system utilizing the following equilibrium reaction between a lactone, base and water.

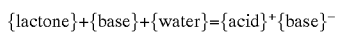

{lactone}+{base}+{water}={acid}$^+${base}$^-$

A polyimide solution may be obtained by using the {acid}$^+${base}$^-$ system as a catalyst and heating the reaction mixture at 140° C. to 180° C. The water produced by the imidation reaction is eliminated from the reaction system by azeotropic distillation with toluene. When the imidation in the reaction system is completed, {acid}$^+${base}$^-$ is converted to the lactone and the base, and they lose the catalytic activity and are removed from the reaction system with the toluene. The polyimide solution produced by this process can be industrially used as it is as a polyimide solution with high purity because the above-mentioned catalytic substances are not contained in the polyimide solution after the reaction.

Examples of the reaction solvent which may be used in the above-mentioned imidation reaction include, in addition to the above-mentioned toluene, polar organic solvents. Examples of these organic solvents include N-methyl-2-pyrrolidone, dimethylformamide, dimethylacetamide, dimethylsulfoxide, sulfolane and tetramethylurea.

As the lactone, γ-valerolactone is preferred. As the base, pyridine and/or methylmorpholine is(are) preferred.

The mixing ratio (acid/diamine) between the tetracarboxylic dianhydride and the diamine subjected to the imidation reaction is preferably about 1.05 to 0.95 in terms of molar ratio. Further, the concentration of the acid dianhydride based on the total reaction mixture is preferably about 4 to 16% by weight, the concentration of the lactone is preferably about 0.2 to 0.6% by weight, the concentration of the base is preferably about 0.3 to 0.9% by weight, and the concentration of the toluene is preferably about 6 to 15% by weight at the initiation of the reaction. The reaction time is not restricted and varies depending on the molecular weight of the polyimide to be produced and the like, and usually about 2 to 10 hours. It is preferred to carry out the reaction under stirring.

It should be noted that the production process per se of the polyimide using the binary catalytic system comprising the lactone and the base is known, and described in, for example, U.S. Pat. No. 5,502,143.

Examples of diluents include ketone solvents such as acetone, cyclohexane, methyl ethyl ketone and methyl isobutyl ketone; cellosolve solvents such as methyl cellosolve, methyl cellosolve acetate, ethyl cellosolve acetate and butyl cellosolve acetate; ester solvents such as ethyl acetate, butyl acetate, isoamyl acetate, γ-butyrolactone and methyl 3-methoxypropionate; and cyclic ether compounds such as dioxane and dioxolan.

Further, propionic acid derivatives such as methyl methylpropionate; lactates such as ethyl lactate; and propylene glycol monomethylether acetate, which draw attention as low toxic solvents in recent years, may also be used.

The above-mentioned solvents may be used individually or in combination. An aliphatic alcohol such as isopropyl alcohol may be added to these solvents in an appropriate amount.

Although the polyimide used in the method of the present invention may be composed of one tetracarboxylic dianhydride and one diamine, by using not less than two components as at least one of the tetracarboxylic dianhydride and the diamine so as to form a copolymer containing totally not less than 3 components, desired properties such as light transmittance, high resolution, adhesion with substrate, developing properties by alkalis, and resistance to dry etching may be given. In this case, with a random copolymer, it is difficult to arbitrarily control the properties of the polyimide produced, so that it is usually difficult to improve the properties of the polyimide. In general, improvement of properties of the polyimide is carried out by block copolymerization.

By carrying out the above-described imidation reaction sequentially in two steps using different acid dianhydrides and/or different diamines, polyimide block copolymers can be produced. By the conventional process for producing polyimide through polyamic acid, only random copolymers can be produced as copolymers. Since polyimide block copolymers can be produced selecting arbitrary acids and/or diamines, desired properties or functions as mentioned above can be given to the polyimide. In the method of the present invention, such a polyimide copolymer may preferably be employed.

A preferred process for producing the polyimide block copolymers include the process wherein a polyimide oligomer is produced using the acid catalyst generated by the above-described lactone and the base, and using either one of the aromatic diamine component or the tetracarboxylic dianhydride in excess, and then the aromatic diamine and/or the tetracarboxylic dianhydride is(are) added (the molar ratio of the total aromatic diamines to the total tetracarboxylic dianhydride is 1.05 to 0.95), thereby carrying out two-step polycondensation.

Polyimide block copolymers containing (an) alicyclic tetracarboxylic dianhydride(s), diaminosiloxane(s) and (an) aliphatic disulfide(s) may be used as materials for photolithography giving a resolution of less than 1 μm.

To give high and precise resolution to the polyimide block copolymer, the block copolymer may preferably be an amorphous aliphatic or alicyclic polyimide block copolymer containing (a) group(s) having distortion, such as spiro ring group, in addition to the above-mentioned component, thereby accelerating photodegradation of the polyimide.

To promote the transparency to a light having a short wavelength or to electron beam, the polyimide used in the method of the present invention preferably does not substantially contain conjugated double bond and an aromatic structure. The term "does not substantially contain" means that the amount of the conjugated double bond and the aromatic structure is in a degree at which the object of the present invention, that is, to form a pattern with a high resolution, is not adversely affected. Usually, the amount(s) of the monomer(s) having conjugated double bond or aromatic structure is preferably not more than 10 mol %, more preferably not more than 5 mol %, and most preferably 0 mol % based on the total polyimide.

The polyimide used in the method of the present invention may contain (a) phenolic hydroxyl group(s), carboxyl group (s), thiophenol group(s) or sulfonate group(s), or (a) group (s) derived from these groups which yield these groups by the above-mentioned photoacid generator. However, unlike the conventional photosensitive polyimides, the polyimide shows photosensitivity even without these groups when a suitable developing solution is used.

In cases where the above-described polyimide is used as a positive-type photosensitive polyimide, a photoacid generator is used together. The term "photoacid generator" herein means a compound which generates an acid upon irradiation with light or electronic beam. Since the polyimide is decomposed by the action of the acid and is made soluble in alkalis, the photoacid generator employed in the present invention is not restricted and any compound which generates an acid upon irradiation with light or electron beam may be employed. Preferred examples of the photoacid generator include onium salts having naphthalene skeleton or benzothiophene skeleton, and sulfonate, sulfonyl and sulfamide compounds.

Preferred examples of the photosensitive quinone diazide compounds include esters of 1,2-naphthoquinone-2-diazide-5-sulfonic acid and 1,2-naphthoquinone-2-diazide-4-sulfonic acid, the counterparts of the esters being low molecular aromatic hydroxyl compounds such as 2,3,4-trihydroxybenzophenone, 1,3,5-trihydroxybenzene, 2-methylphenol, 4methylphenol and 4,4'-hydroxy-propane.

Preferred examples of the onium salts which may be used as the photoacid generator include aryl diazonium salts such as 4(N-phenyl)aminophenyl diazonium salt; diaryl halonium salts such as diphenyl iodonium salt; triphenyl sulfonium salts such as bis{4-(diphenylsulfonio)phenyl} sulfide, and bis-hexafluoroantimonate.

It is preferred to add the photoacid generator in an amount of 5 to 50% by weight based on the weight of the polyimide resin component. In cases where the thickness of the polyimide membrane formed on a substrate is small, it is usually preferred to use a small amount, within the range mentioned above, of the photoacid generator.

The photosensitive polyimide composition according to the present invention may be in the form of a solution suited for application on substrates. In this case, as the solvent, a polar solvent such as N-methyl-2-pyrrolidone, dimethylformamide, dimethylacetamide, dimethylsulfoxide, sulfolane, tetramethylurea or the like, which is used as the solvent for the imidation reaction, may be employed. The concentration of the polyimide in the solution may preferably be 5% to 50% by weight, more preferably 10% to 40% by weight. Since the polyimide obtained by the direct imidation using the catalytic system comprising the lactone and the base is obtained in the form of solution in which the polyimide is dissolved in the polar solvent, and since the concentration of the polyimide in the obtained solution is within the preferred range mentioned above, the polyimide solution produced by the above-described process may advantageously be used as it is. If desired, however, the produced polyimide solution may be diluted with a diluent. As the diluent, a solvent which does not largely decrease the solubility, such as dioxane, dioxolan, γ-butyrolactone, cyclohexanone, propylene glycol monomethyl ether acetate, methyl lactate, anisole, ethyl acetate or the like may be employed, although the diluent is not restricted to these.

To make the composition of the present invention fitted to each final use, the sensitivity of the pattern resolution may be increased by giving a photosensitizer to the photosensitive polyimide of the present invention. Although not restricted, examples of the photosensitizer include Michler's ketone, benzoin ether, 2-methylanthraquinone, benzophenone, benzoic acid esters and the like. Further, modifiers which are added to the ordinary photosensitive polyimides, such as coupling agents, plasticizers, film-forming resins, surfactants, stabilizers, spectrum sensitivity-adjusters and the like may be added. In cases where the adhesion of the polyimide to the substrate is not good, by adding a coupling agent, especially a silane coupling agent such as γ-aminopropyltriethoxysilane, hexamethyldisiloxane, hexarnethyldisilazane or 1,3-bis(3-aminopropyl)tetramethyldisiloxane, the adhesion to the substrate may be improved, so that the polyimide can be used as a photolithography material. In this case, the amount of the silane coupling agent to be added may suitably be about 2 to 0.5% by weight.

By applying the photosensitive polyimide composition of the present invention in the form of solution on a substrate, drying the composition, selectively exposing the composition, and developing the resultant, a polyimide membrane having an arbitrary pattern on the substrate can be formed. Alternatively, by forming a polyimide film from the polyimide composition by a conventional method such as extrusion, adhering the film on a substrate, selectively exposing the film and developing the resultant, a polyimide membrane having an arbitrary desired pattern on the substrate may be formed. Since such a polyimide membrane is resistant to heat and insulative, it may be used as an insulation membrane or dielectric layer in semiconductor devices as it is. Alternatively, it may be used as a photoresist for selectively etching the substrate. In the present specification, in both cases where the polyimide is used as it is as an insulation film or dielectric layer in a semiconductor device or the like, and where the polyimide is used as a photoresist for selective etching of the substrate, polyimide is called "photolithography material". However, even in cases where the patterned polyimide film after development is used as an insulation film or a dielectric layer and not used for the selective etching of the substrate, the polyimide may also be called "photoresist" or "resist" for convenience.

Examples of the substrate to which the photosensitive polyimide of the present invention is applied include semiconductor disks, silicon wafers, germanium, gallium arsenide, glass, ceramics, copper foil, printed boards and the like.

Coating of the composition may be carried out usually by dipping, spraying, roll coating, spin coating or the like. As for the adhesive films, products having uniform thickness may be usually obtained by employing thermocompression bonding.

A preferred mode for forming a pattern using the positive-type photosensitive aliphatic/alicyclic polyimide according to the present invention will now be described.

A varnish containing the photoresist dissolved in the above-mentioned organic solvent is applied on a prescribed substrate by roll coating method, dipping method or the like, and then dried at a temperature of not higher than 150° C., preferably at 70 to 100° C. to form a photoresist film. Examples of the substrate employed here include silicon wafers, blank masks, and III-V group compound semiconductor wafers such as GaAs and AlGaAs. Alternatively, chromium- or chromium oxide-deposited masks, aluminum-deposited substrates, IBPSG-coated substrates, PSG-coated substrates, SOG-coated substrates, and carbon film sputter substrates may also be used. The thickness of the coated film after drying is preferably about 0.2 $\mu$m to 200 $\mu$m.

Selective exposure to an actinic ray is carried out through a mask, or the surface of the photosensitive polyimide film may also be directly irradiated with an actinic ray. Examples of the actinic ray include various UVs such as i-line, h-line and g-line of low pressure mercury lamp, light from xenon lamp, and far ultraviolet rays such as excimer laser beams from KrF, ArF or the like, X-ray, electron beam, gamma ray, neutron ray and ion beams. The advantageous effect of the present invention is maximally obtained when the exposure is carried out using i-line, KrF excimer laser or ArF excimer laser, which has a short wavelength. That is, the advantageous effect of the present invention is maximally obtained when using a light having a wavelength of not more than 365 nm, especially less than 250 nm (e.g., KrF and ArF excimer laser). The dose of irradiation may be appropriately selected depending on the photoabsorption rate by the polyimide, the type of the light, the type of the pattern to be formed and the like, by conducting a routine experiment, and when UV light is used, the dose of irradiation is usually about 100 to 3000 mJ/cm$^2$.

The photoresist film is then optionally heated (baked) at 50° C. to 150° C., preferably 60° C. to 120° C. by heating on a hot plate or in an oven, or by irradiation with infrared light. If the temperature of the heat treatment is lower than 50° C., the acid generated by the photoacid generator may not sufficiently react with the compound having the substituent groups decomposed by the acid. On the other hand, if the temperature is higher than 150° C., the exposed area and the non-exposed area of the photoresist film may be excessively decomposed or excessively cured. By the above-mentioned baking, in the exposed area of the photoresist film, the acid generated by the exposure acts as a catalyst and reacts with the compound having substituent groups which are decomposed by the acid. That is, the substituent groups on the compound, which groups are decomposed by the acid, are decomposed so that the compound is converted to an alkali-soluble compound. In some cases, by leaving the photoresist film at room temperature for a long time, the same effect obtained by the above-mentioned post-baking may be obtained.

The photoresist film after baking is then subjected to development with an alkaline developer by immersion method or spray method to selectively dissolving and removing the exposed areas of the photoresist film, thereby obtaining the desired pattern. Examples of the alkaline solution used as the developer include inorganic aqueous alkaline solutions such as aqueous solutions of sodium hydroxide, sodium carbonate and sodium metasilicate, and organic aqueous alkaline solutions such as aqueous solutions of tetramethylammonium hydroxide, trimethylhydroxyammonium hydroxide and ethanolamine, as well as these aqueous solutions to which one or more alcohols, surfactants or the like are added.

Since the photosensitive composition according to the present invention has very high solubility in alkali, the polyimide membrane pattern is free from cracks and jagging, and the pattern is not collapsed. Further, the pattern can be formed with a high reproducibility. In addition, the obtained pattern has a very high resolution. Therefore, by using the resist pattern as an etching mask for dry etching, very fine pattern with a size of less than 1 μm can be accurately transcribed to the exposed substrate. One or more steps other than those mentioned above may be added without any problems. For example, a step of forming a flat layer used as the bed layer of the photoresist film, a pre-treatment step for improving adhesiveness between the photoresist film and the bed layer, a rinsing step for removing the developer with water or the like after development, a step of re-irradiation of UV before dry etching and/or the like may be optionally carried out.

As described above, in the photosensitive composition according to the present invention, since (an) aliphatic or alicyclic compound(s), especially (an) alicyclic compound (s) is(are) incorporated in the main chain of the polymer, resistance to dry etching was drastically improved without deteriorating the transparency. As the resins for forming resists, those containing benzene ring, such as cresol novolak and polyhydroxystyrene are conventionally used. However, these resins have poor transparency to UVs having extremely short wavelengths.

Since (an) aliphatic or alicyclic compound(s), especially (an) alicyclic compound(s) is(are) incorporated in the main chain of the polyimide, both the transparency to the UVs having extremely short wavelengths and the resistance to dry etching are simultaneously satisfied.

A further advantage of using the block copolymer polyimide compound is that the solubility in alkalis of the area of the resist in which the molecular chains are cleaved by the photoacid generator is increased by introducing (an) ether bond(s), amine bond(s) and/or disulfide bond(s), so that the resolution of the resist is further improved.

Thus, by forming a resist film on a substrate by applying the photosensitive composition according to the present invention on a substrate, irradiation of actinic ray (exposure), heating (baking) and by development with an alkali, fine resist pattern with good pattern profile can be formed. In turn, by conducting dry etching on the substrate using the resist pattern as a mask, the pattern can be accurately transcribed to the substrate without sagging or the like of the pattern.

After the selective exposure, the irradiated regions of the photoresist layer may be removed by treating the photoresist layer with an alkaline aqueous solution as a developing solution. The treatment may be carried out by, for example, dipping the photoresist layer or spraying the developer under pressure to the photoresist layer so as to dissolve the exposed regions thereof.

The development time varies depending on the energy of exposure, strength of the developer, manner of development, preheating temperature, temperature of the treatment with the developer and the like. Usually, with the development by dipping, the development time is about 1 to 10 minutes, and with the development by spraying, the development time is usually about 10 to 40 seconds. The development is stopped by, for example, dipping the developed layer in an inactive solvent such as isopropanol or deionized water, or by spraying such a solvent.

By using the positive-type photosensitive polyimide composition according to the present invention, polyimide coating layers having a layer thickness of 0.2 to 50 μm, and relief structures having sharp edges may be formed.

Since the polyimide in the composition of the present invention is composed of complete linear polyimide, it is not changed in water or heating, and its storage stability is good. Therefore, it can be used as photosensitive films. Further, after forming the pattern by development, unlike the polyamic acid molecules, the postbake at 250 to 450° C. is not necessary, and only drying under heat at 120 to 200° C. to evaporate the solvent is carried out. Further, the polyimide membrane after forming the pattern is tough, resistant to high temperature and excellent in mechanical properties.

The resolution and photosensitivity, as well as the heat resistance, chemical resistance and mechanical strength, of the positive-type photosensitive polyimide, are variable depending on the molecular weight and the molecular weight distribution. There is a tendency that the larger the molecular weight and the smaller the imide group content, the longer the development time and the dipping time in the alkali solution. As for heat resistance, chemical resistance and mechanical strength, polyimides having average molecular weights in terms of polystyrene of 5000 to 100,000, preferably 10,000 to 50,000 give good results.

The above-described polyimide, when selectively exposed with an actinic ray such as electron beam, shows negative-type photosensitivity. A preferred mode of the method for forming a pattern with negative-type photosensitivity will now be described.

A varnish containing the photoresist dissolved in the above-mentioned organic solvent is applied on a prescribed substrate by roll coating method, dipping method or the like, and then dried at a temperature of not higher than 150° C., preferably at 80 to 120° C. to form a photoresist film. Examples of the substrate employed here include silicon wafers, blank masks, and III-V group compound semiconductor wafers such as GaAs and AlGaAs. Alternatively, chromium- or chromium oxide-deposited masks, aluminum-deposited substrates, IBPSG-coated substrates, PSG-coated substrates, SOG-coated substrates, and carbon film sputter substrates may also be used. The thickness of the coated film after drying is preferably about 0.2 μm to 200 μm.

Selective exposure to an actinic ray is carried out through a mask, or the surface of the photosensitive polyimide layer may also be directly irradiated with an actinic ray. Examples of the actinic ray include X-ray, electron beam, gamma ray, neutron ray and ion beams. The advantageous effect of the resist composition according to the present invention is maximally obtained when the exposure is carried out using electron beam. The dose of irradiation may be appropriately selected depending on the absorption rate of the electron beam by the polyimide, the type of the pattern to be formed and the like, by conducting a routine experiment, and the dose of irradiation is usually about 1 $\mu C/cm^2$ to 1000 $\mu C/cm^2$.

The photoresist film is then optionally heated (baked) at 80° C. to 150° C., preferably 80° C. to 120° C. by heating on a hot plate or in an oven, or by irradiation with infrared light. Then a required dose of electron beam is irradiated.

Then the photoresist film is subjected to development with an alkaline developer by immersion method to selectively dissolving and removing the non-exposed areas of the photoresist film, thereby obtaining the desired pattern. Examples of the alkaline solution used as the developer include inorganic aqueous alkaline solution such as aqueous solutions of sodium hydroxide, sodium carbonate and sodium metasilicate, and organic aqueous alkaline solutions such as aqueous solutions of tetramethylammonium hydroxide, trimethylhydroxyammonium hydroxide and ethanolamine, as well as these aqueous solutions to which one or more alcohols, surfactants or the like are added.

Since the aliphatic/alicyclic polyimide composition according to the present invention has very high solubility in alkali, the polyimide membrane pattern is free from cracks and jagging, and the pattern is not collapsed. Further, the pattern can be formed with a high reproducibility. In addition, the obtained pattern has a very high resolution. Therefore, by using the resist pattern as an etching mask for dry etching, very fine pattern with a size of less than 1 μm can be accurately transcribed to the exposed substrate. One or more steps other than mentioned above may be added without any problems. For example, a step of forming a flat layer used as the bed layer of the photoresist film, a pre-treatment step for improving adhesiveness between the photoresist film and the bed layer, a rinsing step for removing the developer with water or the like after development, a step of re-irradiation of UV before dry etching and/or the like may be optionally carried out.

Since (an) aliphatic or alicyclic compound(s), especially (an) alicyclic compound(s) is(are) incorporated in the main chain of the aliphatic/alicyclic polyimide of the present invention, both the transparency to the lights having extremely short wavelengths and the resistance to dry etching are simultaneously satisfied.

A further advantage of using the block copolymer polyimide compound is that by introducing (an) ether bond(s), amine bond(s) and/or disulfide bond(s), intermolecular crosslinking reaction occurs by irradiation with electron beam, so that the solubility in alkalis of the exposed area of the resist is decreased and the resolution of the resist is further improved.

Thus, by forming a resist film on a substrate by applying the photosensitive composition according to the present invention on a substrate, irradiation of electron beam (exposure), heating (baking) and by development with an alkali, fine resist pattern with good pattern profile can be formed. In turn, by conducting dry etching on the substrate using the resist pattern as a mask, the pattern can be accurately transcribed to the substrate without sagging or the like of the pattern. After the selective exposure, the non-irradiated regions of the photoresist layer may be removed by treating the photoresist layer with an alkaline aqueous solution as a developing solution. The treatment may be carried out by, for example, dipping the photoresist layer so as to dissolve the non-exposed regions thereof.

The development time varies depending on the energy of exposure, strength of the developer, manner of development, preheating temperature, temperature of the treatment with the developer and the like. Usually, with the development by dipping, the development time is preferably 30 seconds to 4 minutes. The development may be stopped by, for example, dipping the developed layer in an inactive solvent such as isopropanol or deionized water, or by spraying such a solvent.

By using the negative-type aliphatic/alicyclic polyimide employed in the present invention, polyimide coating layers having a layer thickness of 0.05 to 1 μm, and relief structures having sharp edges may be formed.

Since the aliphatic/alicyclic polyimide in the composition of the present invention is composed of complete linear polyimide, it is not changed in water or heating, and its storage stability is good. Therefore, it can be used as photosensitive films. Further, after forming the pattern by development, unlike the polyamic acid molecules, the post-bake at 250 to 450° C. is not necessary, and only drying under heat at 120 to 200° C. to evaporate the solvent is carried out. Further, the polyimide membrane after forming the pattern is tough, resistant to high temperature and excellent in mechanical properties.

The resolution and photosensitivity, as well as the heat resistance, chemical resistance and mechanical strength, of the negative-type photosensitive polyimide, are variable depending on the molecular weight and the molecular weight distribution, as in the positive-type photosensitive polyimide.

The present invention will now be described in more detail by way of examples thereof.

Since characteristic photosensitive polyimides are obtained by various combinations of acid dianhydrides and aromatic diamines, the present invention is not restricted to these examples.

REFERENCE EXAMPLE 1

A stainless steel anchor agitator and reflux condenser were attached to a 500 ml three-necked separable flask, the condenser comprising a trap and a cooling tube having balls and mounted on the trap.

To this flask, 26.27 g (0.125 mol) of cyclopentanetetra-carboxylic dianhydride (commercial product of Aldrich), 6.21 g (0.025 mol) of 1,3-bis(3-aminopropyl) tetramethyldisiloxane (commercial product of Shin-etsu Chemical Co., Ltd., molecular weight: 248.5), 1.3 g (0.0 13 mol) of δ-valerolactone, 2.1 g (0.026 mol) of pyridine, 150 g of γ-butyrolactone and 50 g of toluene were added.

After stirring the mixture at 180 rpm at room temperature under nitrogen atmosphere for 0.5 hours, 17.72 g (0.05 mol) of 3,4-bis(3-aminopropyl)-2,4,8,10-tetraoxaspiro{5,5}undecane (commercial product of Tokyo Chemical Industry Co., Ltd.), 10.02 g (0.05 mol) of 1,4-bis(3-aminopropyl) piperazine (commercial product of Tokyo Chemical Industry Co., Ltd.), 100 g of γ-butyrolactone and 50 g of toluene were added. After stirring the mixture at room temperature for 1 hour, the mixture was heated at 180° C. and stirred at 180 rpm for 4 hours and 5 minutes. During the reaction, toluene-water azeotrope was removed.

The polymer concentration of the polyimide solution thus obtained was 20% by weight. The molecular weight of this polyimide was measured by high performance liquid chromatography (commercial product of Tosoh Corporation). The molecular weights based on polystyrene were: Most Frequent Molecular Weight (M): 24,700; Number Average Molecular Weight (Mn): 17,900; Weight Average Molecular Weight (Mw): 37,800; Z Average Molecular Weight (Mz): 93,400; Mw/Mn=2.11; Mz/Mn=4.67. The characteristics of this aliphatic polyimide copolymer (19–53) are shown in Tables 1-1 and 1-2.

REFERENCE EXAMPLE 2

Operations were carried out as in Reference Example 2.

To the flask, 52.85 g (0.2 mol) of 5(2,5-dioxo-tetrahydrofurfuryl)-3-methyl-3-cyclohexene-1,2-dicarboxylic anhydride (commercial product of Tokyo Chemical Industry Co., Ltd.), 12.43 g (0.05 mol) of 1,3-bis(3-aminopropyl)tetramethyldisiloxane (molecular weight: 248.5), 7.26 g (0.05 mol) of N,N-bis(3-aminopropyl) methylamine (commercial product of Tokyo Chemical Industry Co., Ltd.), 2.0 g (0.02 mol) of δ-valerolactone, 3.2 g (0.04 mol) of pyridine, g of γ-butyrolactone and 70 g of toluene were added.

After stirring the mixture at 180 rpm at room temperature under nitrogen atmosphere for 1 hour, 27.44 g (0.10 mol) of 3,4-bis(3-aminopropyl)-2,4,8,10-tetraoxaspiro {5,5} undecane (commercial product of Tokyo Chemical Industry Co., Ltd.), 128 g of γ-butyrolactone and 30 g of toluene were added. After stirring the mixture at room temperature for 1 hour, the mixture was heated at 180° C. and stirred at 180 rpm for 3 hours and 5 minutes. During the reaction, toluene-water azeotrope was removed.

The polymer concentration of the polyimide solution thus obtained was 20% by weight. The molecular weight of this polyimide was measured by high performance liquid chromatography (commercial product of Tosoh Corporation). The weight average molecular weight (Mw) in terms of polystyrene was 73920. The characteristics of this aliphatic polyimide copolymer (19–56) are shown in Tables 1-1 and 1-2.

REFERENCE EXAMPLE 3–REFERENCE EXAMPLE 7

The operations as in Reference Example 1 were repeated except that the type of the acid dianhydride and the diamine constituting the polyimide copolymer were changed. The reaction time of the second step in Reference Example 1 is shown in Table 1.

TABLE 1-1

Synthesis Reaction of Various Aliphatic Polyimide Copolymers

| Reference Examples | Synthesis No. | Composition of Materials of Synthesis Reaction | Reaction Time of Second Step | Polyimide Concentration/ Solvent |
|---|---|---|---|---|
| Reference Example 1 | 19-53 | (3.5 Cp + 0.5 SiP) (Spi + Pip) | 4'05" | 20%/Lc |
| Reference Example 2 | 19-56 | (2.0 Ma + 0.5 SiM + 0.5 Am) (Spi) | 3'05" | 20%/Lc |
| Reference Example 3 | 19-48 | (2.5 Ma + 0.5 SiP) (Spi + Pip) | 3'20" | 20%/Lc |
| Reference Example 4 | 19-26 | (2 PMD + 1 Si) (2 Ma + SS + 2 Spi) | 4'00" | 20%/NMP |
| Reference Example 5 | 18-201 | (2 Cp + 1 Ch) (Phss) | 4'40" | 20%/NMP |
| Reference Example 6 | 19-12 | (2 Cp + 1 Ch) (ss) | 3'00" | 20%/NMP |
| Reference Example 7 | 19-45 | (2.5 BCD + 0.5 SiP) (Spi + Dicy) | 2'00" | 20%/NMP |

(Explanation of Symbols in the Tables) (The numbers in front of the symbols in the tables indicate the number of moles of the material).

Cp: cis-1,2,3,4-cyclopentanetetracarboxylic dianhydride
SiP: 1,3-bis(3-aminopropyl)tetramethyldisiloxane
Spi: 3,4-bis(3-aminopropyl)-2,4,8,10-tetraoxaspiro{5,5}undecane
Pip: 1,4-bis(3-aminopropyl)piperazine
Ma: 5(2,5-dioxo-tetrahydrofurfuryl)-3-methyl-3-cyclohexene-1,2-dicarboxylic anhydride
SiM: 1,3-bis(3-aminopropyl)tetramethyldisiloxane
PMD: pyromellitic dianhydride
Si: diaminosiloxane (average amine value: 421)
SS: 2,2'-diamininoethyldisulfide
Am: N,N-bis(3-aminopropyl)methylamine
Ch: 1,3-bis(aminomethyl)cyclohexane
Phss: bis(4-aminophenyl)disulfide
ss: 2,2'-diaminodiethyldisulfide
BCD: bicyclo(2,2,2)-oct-7-ene-2,3,5,6-tetracarboxylic dianhydride
Dicy: 4,4'-diamino-dicyclohexylmethane
Reaction Time of Second Step in Reference Example 1
4 hours and 5 minutes (4'05"): hereinafter described in the same manner
Polyimide Concentration/Solvent: Polyimide concentration is expressed in terms of % by weight in the solvent.
Lc: butyrolactone
NMP: N-methylpyrrolidone

EXPLANATION OF TABLE 1-2

Including of Si: Whether the aliphatic polyimide copolymer molecule contains Si element or not
Adhesion to Substrate: Aliphatic polyimide copolymer was applied on a silicon wafer substrate by spin-coating method, and the adhesion of the aliphatic polyimide

TABLE 1-2

Molecular Characteristics and Absorption Rate of UV of Various Aliphatic Polyimide Copolymers

| Reference Examples | Synthesis No. | Including of Si | Adhesion to Substrate | Polyimide Molecule Double bond | Benzene Ring | Absorption Rate (%) of Wavelength 248 nm |
|---|---|---|---|---|---|---|
| Reference Example 1 | 19-53 | yes | yes | 0 | 0 | 34 |
| Reference Example 2 | 19-56 | yes | yes | 4 | 0 | 98 |
| Reference Example 3 | 19-48 | yes | yes | 5 | 0 | 98 |
| Reference Example 4 | 19-26 | yes | yes | 4 | 2 | 68 |
| Reference Example 5 | 18-201 | no | no | 0 | 2 | n.d. |
| Reference Example 6 | 19-12 | no | no | 0 | 0 | n.d. |
| Reference Example 7 | 19-45 | yes | no | 2.5 | 0 | n.d. | n.d.: not determined

EXPLANATION OF TABLE 1-1

Synthesis Reaction, Composition of Materials: The upper line indicates the composition of the materials in the reaction of the first step, and the lower line indicates the composition of the materials in the reaction of the second step.

copolymer was evaluated by cross cut test (peeling off of lattices of 1 mm, 10×10 is not observed in adhesion test)
Absorption Rate of 248 nm: Photoabsorption of the polyimide solution was measured. Aliphatic polyimide copolymer having no double bond is subjected to experiment.

All of the polyimides described in References 1 to 7 can be used as the materials for photolithography. Although the polyimides obtained in Reference Examples 5 to 7 have poor adhesion to the substrate, they may be used as the materials for photolithography by blending a silane coupling agent as mentioned above. Although the polyimide obtained in Reference. Examples 2 and 3 have large absorption rates of KrF (248 nm) line, photolithography can be attained by using KrF line by increasing the dose of irradiation, or by using a light having a longer wavelength, photolithography can be attained with a normal dose of radiation.

EXAMPLE 1

(A) Process of Producing 2,2'-diaminodiethyl disulfide

In one-liter beaker, 100 g of cystamine, 44.2 g of potassium hydroxide and 440 g of isopropylalcohol were placed, and the mixture is stirred over one day and night with a magnetic stirrer. The solution was filtered and concentrated by a rotary evaporator at 60° C. to obtain 48 g (yield 72%) of 2,2'-diaminodiethyl disulfide.

(B) The operations as in Reference Example 1 were repeated.

To the flask, 19.86 g (0.08 mol) of BCD, 33.68 g (0.04 mol) of diaminosiloxane (amine value: 421), 1.6 g (0.016 mol) of δ-valerolactone, 2.6 g (0.032 mol) of pyridine, 200 g of N-methylpyrrolidone and 100 g of toluene were added.

After stirring the mixture at 180 rpm at room temperature under nitrogen atmosphere for 1 hour, the mixture was heated at 180° C. and stirred at 180 rpm for 1 hour. During the reaction, toluene-water azeotrope was removed.

After cooling the mixture to room temperature, 16.8 g (0.08 mol) of cyclopentanetetracarboxylic dianhydride, 6.1 g (0.04 mol) of 2,2'-diaminodiethyldisulfide, 11.38 g (0.08 mol) of 1,3-bis(aminomethyl)cyclohexane, 128 g of γ-butyrolactone and 30 g of toluene were added. After stirring the mixture at 180 rpm at room temperature under nitrogen atmosphere for 1 hour, the mixture was heated at 180° C. and stirred at 180 rpm for 2 hours. During the reaction, toluene-water azeotrope was removed.

The polymer concentration of the polyimide solution thus obtained was 20% by weight. The molecular weight of this polyimide was measured by high performance liquid chromatography (commercial product of Tosoh Corporation). The molecular weights based on polystyrene were: Number Average Molecular Weight (Mn): 9000; Weight Average Molecular Weight (Mw): 10,700; Z Average Molecular Weight (Mz): 13,000.

(C) The same operations as in above-described (B) were carried out except that the reaction in the second step was carried out for 3 hours. The polymer concentration of the polyimide solution thus obtained was 20% by weight. The molecular weight of this polyimide was measured by high performance liquid chromatography (commercial product of Tosoh Corporation). The molecular weights based on polystyrene were: Number Average Molecular Weight (Mn): 12,300; Weight Average Molecular Weight (Mw): 17,400; Z Average Molecular Weight (Mz): 25,000.

(D) To 110 g of the polyimide solution obtained in (C), 50 g of methanol was added and the mixture was stirred. To the mixture, 50 g of water was added dividedly in three times. The generated precipitates were separated by decantation, and 50 g of methanol, and then 100 g of water were added thereto. The mixture was heated to 60° C. and stirred, followed by decantation. To the obtained product, 50 ml of methanol was added and the mixture was heated to 60° C., followed by stirring, leaving to stand and then decantation. To the obtained product, 100 g of dioxolan was added to dissolve the precipitates, and the resulting solution was filtered through a 0.8 μm pore filter, followed by concentration and evaporation to dryness by a rotary evaporator. The product was dried in vacuum at 1 mmHg at 110° C. to obtain powder. The powder was dissolved in dimethylformamide and subjected to high performance liquid chromatography (commercial product of Tosoh Corporation). The molecular weights based on polystyrene were: Number Average Molecular Weight (Mn): 15,000; Weight Average Molecular Weight (Mw): 20,000; Z Average Molecular Weight (Mz): 27,600. Decomposition of this compound started at 387° C.

EXAMPLE 2

Method for Forming Images (A) One gram of the polyimide powder obtained in Example 1(D), 19 g of dioxolan and 0.2 g of a photosensitizer (NT-200: triester between 2,3,4-trihydroxybenzophenone and 6-diazo-5,6-dihydro-5-oxo-naphthalene-1-sulfonic acid (commercial product of Toyo Gosei Co., Ltd.) were mixed and dissolved. The solution was filtered through a 0.2 μm pore filter and the obtained polyimide solution was applied on the surface of a silicon wafer substrate by spin-coating method. After coating the solution at 500 rpm for 5 seconds and at 5000 rpm for 30 seconds, the resulting substrate was prebaked in an infrared dryer at 90° C. for 10 minutes. The thickness of this polyimide film was 0.4 μm.

On this photoresist coating layer, a test pattern for positive-type photomask was placed, and the photoresist was irradiated by a mercury lamp i-line irradiation apparatus at a dose of 200 mJ/cm². This photosensitive photoresist film was developed with 0.05% aqueous solution of tetramethylammonium hydroxide (TMAH) for 19 seconds, and then dried by an infrared dryer at 150° C. for 10 minutes, followed by observation of the resulting pattern image with an electron microscopy. A sharp image of the line-and-space image of 0.35 μm was observed.

(B) Water was added to the positive-type polyimide solution obtained in Example 1(B) to precipitate the polyimide and the precipitates were recovered by filtration, followed by drying the precipitates under reduced pressure of 1 mmHg at 110° C. to obtain dry powder.

To 1 g of the thus obtained polyimide powder, 9 g of dioxolan and 0.2 g of NT-200 were added, and the mixture was filtered through a 0.2 μm fine pore filter. The resulting composition was applied on a silicon wafer as in (A) to obtain a photosensitive polyimide film having a thickness of 0.52 μm.

On this photoresist coating layer, a test pattern for positive-type photomask was placed, and the photoresist was irradiated by a mercury lamp i-line irradiation apparatus at a dose of 1800 mJ/cm². This photosensitive photoresist film was developed with 0.05% aqueous solution of tetramethylammonium hydroxide for 2 minutes and 20 seconds, and then dried by an infrared dryer at 150° C. for 10 minutes, followed by observation of the resulting pattern image with an electron microscopy. A sharp image of the line-and-space image of 0.40 μm was observed. However, with the image of 0.4 μm, photoresist was left over in the space regions and the boundaries were not clear. It is presumed that this photoresist film contained polyamic acid in addition to polyimide.

EXAMPLE 3

The operations as in Example 2 were repeated except that a KrF (wavelength 248 nm) irradiator was used as the light source, the dose of irradiation was 170 mJ/cm², and that the development was carried out using 0.05% TMAH for 20 seconds.

As a result, a sharp line-and-space pattern with a width of 0.16 μm was formed.

EXAMPLE 4

Resoluting Speed of Various Aliphatic/Alicyclic Polyimide Copolymers

To 2 g of each of various aliphatic/alicyclic polyimide copolymers, 8 g of a solvent (dioxolan or N-methylpyrrolidone) was added to dissolve the polyimide, and the obtained polyimide solution was filtered through a 0.8 μm fine pore filter, followed by addition of 0.2 g of NT-200 to obtain a photosensitive polyimide solution.

The photoresist composition was applied on the surface of a surface-treated copper foil having a diameter of 5 cm (commercial product of Mitsui Metal and Mining Co., Ltd.: thickness 18 μm), and dried by an infrared dryer at 90° C. for 10 minutes. The thickness of the photoresist film was about 10 μm. On this photosensitive film, a test pattern (10, 15, 20, ..., 50 μm, respectively) was placed, and the photosensitive film was irradiated at a dose of exposure at which images are obtained using 2 kW extra-high pressure mercury lamp apparatus (JP-2000G, commercial product of Oak Seisakusho). The development was carried out using varying concentrations of aqueous tetramethylammonium hydroxide (TMAH) as a developing solution in an ultrasonic washer. The resolution of 15 μm was sharp and the resolution of 10 μm was confirmed. The material composition and the patterning conditions of each polyimide are shown in Table 2. The polyimide obtained in Example 8(D) was also subjected to the patterning using mercury g-line, and the results are also shown in Table 2.

EXAMPLE 6

Method for Forming Images With Electron Beam

To 2 g of the polyimide powder obtained in Example 1(D), 18 g of dioxolan was added and the resultant was mixed with a mixer to dissolve the polyimide, thereby obtaining 10% by weight aliphatic polyimide solution, followed by filtering the solution through a 0.2 μm fine pore filter. The polyimide solution was applied on the surface of a silicon wafer substrate by the spin-coating method and the substrate was heated on a hot plate at 100° C. for 30 minutes, at 120° C. for 30 minutes, and at 150° C. for 30 minutes. The thickness of this polyimide film was 1.0 μm.

On this photoresist coating film, a test pattern for negative-type photomask was placed, and the photoresist was irradiated by ELIONIX-5000 electron beam irradiator at an acceleration voltage of 20 kV, beam diameter of 0.3 μm, and at a beam current of 800 pA. The dose of irradiation of the electron beam was within the range of 10 $\mu C/cm^2$ to 1000 $\mu C/cm^2$. The best dose of irradiation of electron beam was 60 $\mu C/cm^2$, and negative-type pattern was obtained. The photoresist film was developed with 0.25% aqueous tetramethylammoniumhydroxide solution for 10 seconds to 1 minute, and then washed with ion-exchanged water. After drying the photoresist at 150° C. for 10 minutes by an infrared dryer, the negative-type pattern image was observed with an electron microscope. A sharp image of line-and-space pattern having a width of 0.35 μm and a thickness of 1 μm was observed.

EXAMPLE 7

Method for Forming Images with Electron Beam

Operations were carried out as in Example 6.

TABLE 2

Resolution Test of Various Aliphatic Polyimide Copolymers

| Examples | Synthesis No. | Material Composition of Synthesis Reaction | Dose of Radiation mJ/cm² | TMAH Concentration (%) | Development Time (min/sec) |
|---|---|---|---|---|---|
| Example 1 | 19-161 | Described in Example 1 | 500 | 0.01 | 1'30" |
| Example 4-1 | 16-118 | (2.0 Ma + Pip + Ch) | 500 | 2 | 3'30" |
| Example 4-2 | 16-120 | (2 BCD + Pip + Ch) | 500 | 10 | 1'20" |
| Example 4-3 | 19-99 | (2 Cp + Am + Ch) | 1000 | 0.01 | 52" |
| Example 4-4 | 19-110 | (2 Cp + Oxy + Ch) | 1000 | 0.05 | 30" |

EXAMPLE 5

Each of the polyimides described in Examples 4-1 to 4-4 was exposed to mercury i-line and patterned as in Example 2. As a result, sharp line-and-space pattern having a width of 0.4 μm was formed.

The conditions of the step of forming the images are shown in Table 3 below.

To the polyimide powder obtained in Example 1(D), dioxolan was added and the resultant was mixed with a mixer to dissolve the polyimide, thereby obtaining 7.5% by weight aliphatic polyimide solution, followed by filtering the solution through a 0.2 μm fine pore filter. The polyimide solution was applied on the surface of a silicon wafer substrate by the spin-coating method and the substrate was

TABLE 3

| Examples | Synthesis No. | Material Composition of Synthesis Reaction | Dose of Radiation mJ/cm² | TMAH Concentration (%) | Development Time (min/sec) |
|---|---|---|---|---|---|
| Example 4-1 | 16-118 | (2.0 Ma + Pip + Ch) | 1800 | 3.0 | 4'30" |
| Example 4-2 | 16-120 | (2 BCD + Pip + Ch) | 1800 | 10 | 6'00" |
| Example 4-3 | 19-99 | (2 Cp + Am + Ch) | 3000 | 0.05 | 1'30" |
| Example 4-4 | 19-110 | (2 Cp + Oxy + Ch) | 3600 | 0.1 | 1'30" | heated on a hot plate at 100° C. for 30 minutes. The thickness of this polyimide film was 200 nm.

On this photoresist coating film, a test pattern for negative-type photomask was placed, and the photoresist was irradiated by ELIONIX-5000 electron beam irradiator at an acceleration voltage of 20 kV, beam diameter of 0.3 μm, and at a beam current of 300 pA. The dose of irradiation of the electron beam was 2.4 μC/cm$^2$ and negative-type pattern was obtained. The photoresist film was developed with 0.25% aqueous tetramethylammoniumhydroxide solution and then washed with ion-exchanged water. After drying the photoresist at 150° C. for 10 minutes by an infrared dryer, the negative-type pattern image was observed with an electron microscope. A sharp image of line-and-space pattern having a width of 100 nm and a thickness of 200 nm was observed.

EXAMPLE 8

Investigation of Resistance to Dry Etching (A) To the polyimide powder obtained in Example 1(D), dioxolan was added and the resultant was mixed with a mixer to dissolve the polyimide, thereby obtaining 10% by weight aliphatic polyimide solution, followed by filtering the solution through a 0.2 μm fine pore filter. The polyimide solution was applied on the surface of a silicon wafer substrate by the spin-coating method and the substrate was heated on a hot plate at 100° C. for 30 minutes, at 120° C. for 30 minutes, and at 150° C. for 30 minutes. The thickness of this polyimide film was 325 nm.

This photoresist coating film was subjected to etching treatment using DEM451 T from ANELVA. On the other hand, the polyimide photoresist material which was not irradiated with electron beam was subjected to the following test for resistance to etching gas. Etching gas: SF6; Gas Flow Rate: 60 sccm; Dose: 80W; Time: 10 minutes. The etching rate was measured. The etching rate of Si was 0.27 μm/min., that of AZ resist was 34 nm/min, and that of the aliphatic polyimide was 1.7 nm/min. Thus, the aliphatic polyimide photoresist showed high resistance to dry etching.

(B) To the polyimide powder obtained in Example 1(D), dioxolan was added and the resultant was mixed with a mixer to dissolve the polyimide, thereby obtaining an aliphatic polyimide solution, followed by filtering the solution through a 0.2 μm fine pore filter. The polyimide solution was applied on the surface of a silicon wafer substrate by the spin-coating method and the substrate was heated on a hot plate at 100° C. for 30 minutes, at 120° C. for 30 minutes, and at 150° C. for 30 minutes. The thickness of this polyimide film was 412 nm.

This photoresist coating film was subjected to etching treatment using DEM45 IT from ANELVA. On the other hand, the polyimide photoresist material which was not irradiated with electron beam was subjected to the following test for resistance to etching gas. Etching gas: SF6; Gas Flow Rate: 60 sccm; Dose: 300W; Time: 10 minutes. After the etching treatment with the reactive ions, the regions irradiated with the electron beam was cured, and this selectivity was 150 times with respect to Si.

What is claimed is:

1. A positive-type photosensitive polyimide composition comprising a solvent-soluble polyimide which shows positive-type photosensitivity in the presence of a photoacid generator, which is obtained by polycondensation of at least one aliphatic tetracarboxylic dianhydride and/or alicyclic tetracarboxylic dianhydride and at least one aliphatic diarnine and/or alicyclic diamine and/or diaminosiloxane; and said photoacid generator.

2. The polyimide composition according to claim 1, wherein the moiety in said aliphatic diamine and/or alicyclic diamine and/or diaminosiloxane, which moiety constitutes the main chain of said polyimide, consists essentially of $C_1$–$C_{15}$ saturated aliphatic structure and/or $C_3$–$C_{15}$ saturated alicyclic structure.

3. The composition according to claim 2, wherein said tetracarboxylic dianhydride is a saturated alicyclic tetracarboxylic dianhydride and/or bicyclo(2,2,2)-oct-7-ene-2,3,5, 6-tetracarboxylic dianhydride and/or 5-(2,5-dioxo-tetrafirfuryl)-3-methyl-4-cyclohexene-1,2-dicarboxylic anhydride.

4. The composition according to claim 3, wherein said saturated alicyclic tetracarboxylic dianhydride comprises a cyclopentanetetracarboxylic dianhydride, and/or cyclohexanetetracarboxylic dianhydride and/or cyclobutanetetracarboxylic dianhydride.

5. The composition according to claim 1, which is a polyimide copolymer comprising two or more diamines selected from the group consisting of 1,3-bis(3-aminomethyl)cyclohexane, 4,4'-diamino-dicyclohexyl-methane, bis(2-aminoethoxy)ethane, N,N-bis(3-aminopropyl)methylamine, ethylenediamine, 2,2'-diaminodiethyldisulfide, 1,4-bis(3-aminopropyl)piperazine, 3,4-bis(3-aminopropyl)2,4,8,10-tetraoxa[5,5]undecane, diaminosiloxane, trans-1,4-diaminocyclohexane, 1,3-diamino-2-hydroxypropane, and 3(4),8(9)-bis(aminoethyl) tricyclo{5,2,1,0 } decane.

6. The composition according to claim 5, wherein said diamine has disulfide structure and/or diaminosiloxane in the moiety constituting the main chain.

7. The composition according to any one of claims 1–6, wherein said polyimide is a polyimide block copolymer obtained by polycondensing said tetracarboxylic dianhydride and said diamine in a solution in the presence of an acid catalyst.

8. The composition according to claim 7, wherein said acid catalyst is a composite catalyst consisting essentially of valerolactone and pyridine or methylmorpholine, and said polyimide block copolymer is one obtained by first polycondensing said tetracarboxylic dianhydride and said diamine in a solution, and then another tetracarboxylic dianhydride and/or diamine is(are) added for polycondensation to attain a final molar ratio of the tetracarboxylic dianhydride(s) to the diamine(s) in said block copolymer of 1:(0.95–1.05).

9. The composition according to claim 1, wherein said polyimide has an average molecular weight in terms of polystyrene of 5000 to 100,000.

10. The composition according to claim 1, wherein said polyimide does not substantially comprise conjugated double bond and aromatic structure.

11. A method for forming polyimide pattern comprising irradiating said polyimide recited in claim 1 with a light in the presence of a photoacid generator, which polyimide is in the form of a thin film coating a substrate; and removing the irradiated regions with an alkaline developing solution.

12. The method according to claim 11, wherein a far-ultraviolet ray with a wavelength of not more than 365 nm is employed as said light.

13. The method according to claim 12, wherein a light beam with a wavelength of not more than 250 nm is employed as said light.

14. A method for forming a pattern of positive-type photosensitive polyimide comprising the steps of forming a photosensitive layer consisting essentially of said polyimide composition according to claim 1 on a substrate; selectively irradiating said photosensitive layer with a light beam having a wavelength of not more than 365 nm; heat-treating said photosensitive layer; and developing said photosensitive layer after said heat-treatment to selectively remove prescribed regions in said photosensitive layer.

15. Use of said polyimide recited in claim 1 as a material for positive-type photolithography.

16. A method for forming negative-type pattern of polyimide comprising coating a substrate with the polyimide recited in claim 1; selectively irradiating the polyimide with an actinic ray, the irradiated regions constituting a desired pattern; and developing the irradiated polyimide with an alkaline solution to dissolve the non-irradiated regions.

17. The method according to claim 16, wherein said actinic ray is electron beam.

18. Use of the polyimide recited in claim 1 as a material for negative-type photolithography.

* * * * *